(12) United States Patent
Pellizzer et al.

(10) Patent No.: US 7,436,692 B2
(45) Date of Patent: Oct. 14, 2008

(54) PHASE CHANGE MEMORY CELL WITH JUNCTION SELECTOR AND MANUFACTURING METHOD THEREOF

(76) Inventors: Fabio Pellizzer, Via Peroz, 16, Follina (IT) 31051; Agostino Pirovano, Via Don A. Barera, 10, Corbetta (IT) 20011

( * ) Notice: Subject to any disclaimer, the term of this patent is extended or adjusted under 35 U.S.C. 154(b) by 329 days.

(21) Appl. No.: 11/312,253

(22) Filed: Dec. 19, 2005

(65) Prior Publication Data
US 2006/0158928 A1  Jul. 20, 2006

(51) Int. Cl.
*G11C 11/00* (2006.01)

(52) U.S. Cl. ......................... 365/148; 365/148
(58) Field of Classification Search ............... 365/148, 365/163
See application file for complete search history.

(56) References Cited

U.S. PATENT DOCUMENTS

| | | | | |
|---|---|---|---|---|
| 3,573,757 A | | 4/1971 | Adams | 340/173 |
| 4,646,266 A | * | 2/1987 | Ovshinsky et al. | 365/105 |
| 5,825,046 A | | 10/1998 | Czubatyj et al. | 257/2 |
| 5,912,839 A | | 6/1999 | Ovshinsky et al. | 365/185.03 |
| 7,361,924 B2 | * | 4/2008 | Breuil et al. | 257/4 |
| 2003/0193053 A1 | | 10/2003 | Gilton | 257/72 |
| 2004/0012009 A1 | | 1/2004 | Casagrande et al. | 257/4 |
| 2004/0016923 A1 | | 1/2004 | Yu et al. | 257/49 |
| 2004/0053461 A1 | | 3/2004 | Moore et al. | 438/225 |
| 2004/0113137 A1 | | 6/2004 | Lowrey | 257/5 |
| 2004/0245517 A1 | | 12/2004 | Campbell | 257/4 |

OTHER PUBLICATIONS

Kounavis, P., et al., "*p-n* Junctions from Sputtered $Ge_{25}Se_{75-x}Bi_x$ Films," *J. App. Phys.*, 66(2):708-710, Jul. 15, 1989.

Tohge, N., et al., "Formation of Chalcogenide Glass *p-n* Junctions," *Appl. Phys. Lett.*, 48(25):1739-1741, Jun. 23, 1986.

* cited by examiner

*Primary Examiner*—Tuan T. Nguyen
(74) *Attorney, Agent, or Firm*—Blakely, Sokoloff, Taylor & Zafman LLP (57) ABSTRACT

A memory cell includes a memory element and a selection element coupled to the memory element. The selection element includes a first junction portion, having a first type of conductivity, and a second junction portion, having a second type of conductivity and forming a rectifying junction with the first junction portion. The first junction portion and the second junction portion are made of materials selected in the group consisting of: chalcogenides and conducting polymers.

33 Claims, 12 Drawing Sheets

PHASE CHANGE MEMORY CELL WITH JUNCTION SELECTOR AND MANUFACTURING METHOD THEREOF

BACKGROUND OF THE INVENTION

1. Field of the Invention

The present invention relates to a phase change memory cell with ovonic threshold switch selector with reduced dimensions and to the manufacturing method thereof.

2. Description of the Related Art

As is known, phase change memories use a class of materials that have the property of switching between two phases having distinct electrical characteristics, associated to two different crystallographic structures of the material, and precisely an amorphous, disorderly phase and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In the chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both the phases are stable. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic materials (also called phase change memory devices) have been already proposed.

Figure 1:
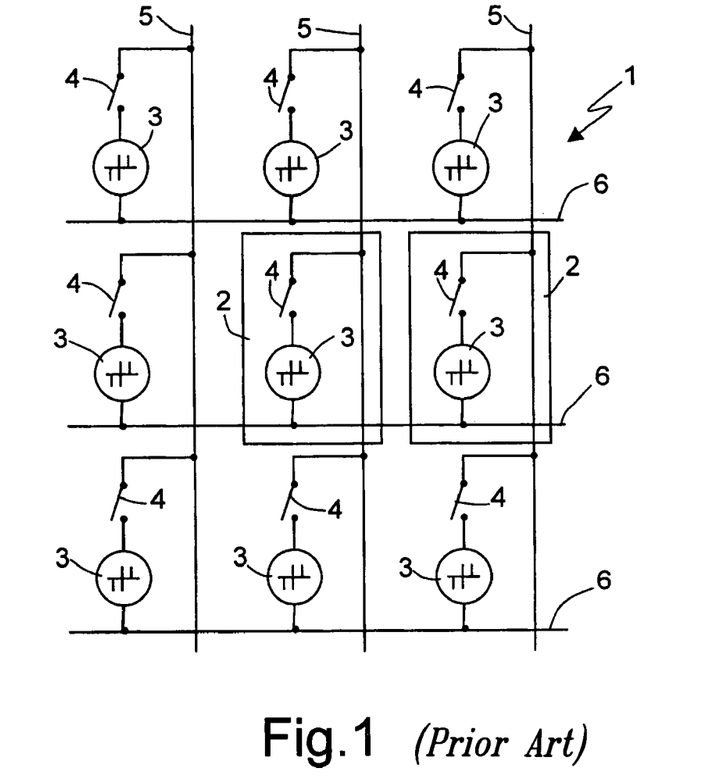
FIG. 1 shows the electrical diagram of a known memory array of the PCM type.

In a phase change memory including chalcogenic elements as a storage element, memory cells are arranged in rows and columns to form an array, as shown in FIG. 1. The memory array 1 of FIG. 1 comprises a plurality of memory cells 2, each including a memory element 3 of the phase change type and a selection element 4 interposed at cross-points of rows 6 (also called word lines) and columns 5 (also called bit lines).

In each memory cell 2, the memory element 3 has a first terminal connected to an own wordline 6 and a second terminal connected to a first terminal of an own selection element 4. The selection element 4 has a second terminal connected a bitline 5. In another solution, the memory element 3 and the selection element 4 of each cell 2 may be exchanged in position.

The composition of chalcogenides suitable for the use in a phase change memory device and a possible structure of a phase change element are disclosed in a number of documents (see, e.g., U.S. Pat. No. 5,825,046).

The selection element 4 may be implemented by any switching device, such as a PN diode, a bipolar junction transistor or a MOS transistor.

For example, U.S. Pat. No. 5,912,839 describes a universal memory element using chalcogenides and including a diode as a switching element. The diode may comprise a thin film such as polycrystalline silicon or other materials.

GB-A-1 296 712 and U.S. Pat. No. 3,573,757 disclose a binary memory formed by an array of cells including a switch element called "ovonic threshold switch" (also referred to as an OTS hereinafter), connected in series with a memory element called "ovonic memory switch" (OMS). The OTS and the OMS are formed adjacent to each other on an insulating substrate and are connected to each other through a conducting strip. Each cell is coupled between a row and a column of a memory array and the OTS has the same function as the selection element 4 in FIG. 1.

The OMS is formed by a chalcogenic semiconductor material having two distinct metastable phases (crystalline and amorphous) having different resistivities, while the OTS is built with a chalcogenic semiconductor material having one single phase (generally amorphous, but sometimes crystalline) with two distinct regions of operation having different resistivities. If the OTS and the OMS have substantially different high resistances, namely with the OTS having a higher resistance than the OMS, when a memory cell is to read, a voltage drop is applied to the cell that is insufficient to trigger the OMS when the latter is in its high resistance condition (associated with a digital "0" state), but is sufficient to drive the OTS in its low resistance condition when the OMS is already in its low resistance condition (associated with a digital "1" state).

Figure 2:
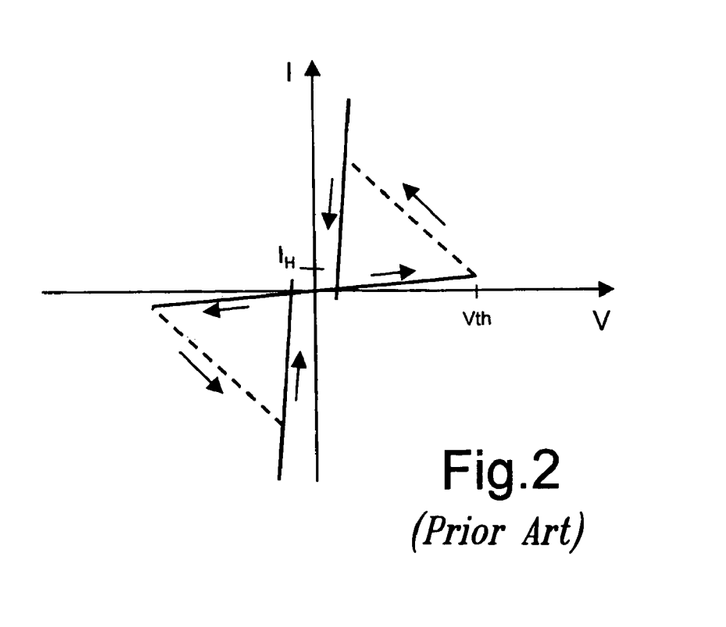
FIG. 2 illustrates the characteristic current-voltage of an OTS.

OTS (see, e.g., U.S. Pat. No. 3,271,591, describing its use in connection with memory elements of the change phase type) have the characteristic shown in FIG. 2. An OTS has a high resistance for voltages below a threshold value $V_{th}$; when the applied voltage exceeds the threshold value $V_{th}$, the switch begins to conduct at a substantial constant, low voltage and presents a low impedance. When the current through the OTS falls below a holding current $I_H$, the OTS goes back to its high-impedance condition. This behavior is symmetrical and occurs also for negative voltages and currents.

As discussed in U.S. Pat. No. 6,816,404, in the name of STMicroelectronics S.r.l. and Ovonyx Inc., a memory element of a phase change memory device comprises a chalcogenic material and a resistive electrode, also called heater.

In fact, from an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply a voltage/current pulse of a suitable length and amplitude and allow the chalcogenic material to cool slowly. In this condition, the chalcogenic material changes its state and switches from a high resistivity to a low resistivity state (also called the set state).

Vice versa, when the chalcogenic material is in the set state, it is necessary to apply a voltage/current pulse of suitable length and high amplitude so as to cause the chalcogenic material to switch to the amorphous phase.

According to U.S. Pat. No. 6,816,404, to reduce the amount of current needed to cause the chalcogenic material to change its state, the heater is formed by a wall structure obtained by depositing a suitable resistive material. Furthermore, the chalcogenic material includes a thin portion extending transversely to the wall structure, so as to obtain a small contact area. Here, the selection element is implemented by a bipolar junction diode formed in a semiconductor substrate just below the memory element.

However, known OTS suffer from current leakage in the amorphous (reset) state, which correspond to an open-switch configuration. Although the OTS chalcogenic layer has high resistivity, in fact, a substantial amount of current flows when a voltage is applied across the OTS, thereby resulting in an undesired power consumption.

BRIEF SUMMARY OF THE INVENTION

One embodiment of the invention provides an improved phase change memory device having reduced power consumption and leakage.

BRIEF DESCRIPTION OF THE SEVERAL VIEWS OF THE DRAWING(S)

For the understanding of the present invention, preferred embodiments thereof are now described, purely as non-limitative examples, with reference to the enclosed drawings, wherein.

DETAILED DESCRIPTION OF THE INVENTION

Herebelow, a process for manufacturing a phase change memory device having a glue layer of dielectric material is described with reference to FIGS. 3-12.

Figure 3:
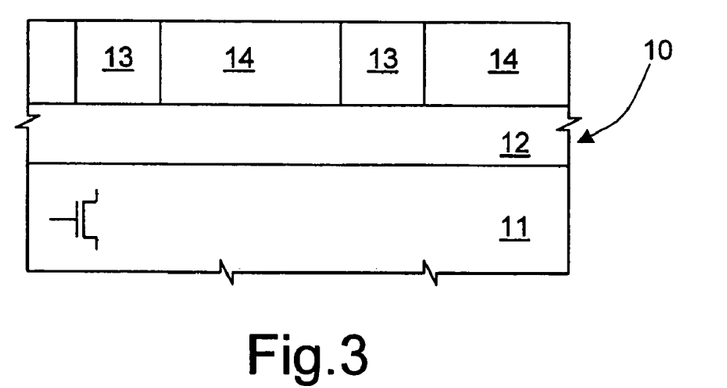
FIGS. 3-10 show cross-sections through a semiconductor device according to a first embodiment of the invention, in subsequent manufacturing steps, taken along line X-X of FIG. 12.

Initially, FIG. 3, a wafer 10 including a substrate 11 of semiconductor material, e.g., silicon, is subject to usual steps to form circuitry components and any element to be integrated into the substrate 11. For example, in a per se known manner and thus not shown, decoding components are integrated in the substrate 11, as represented schematically by a MOS transistor.

Then, the wafer 10 is coated by an insulating layer 12. Row lines 13, e.g., of copper, are formed on top of the insulating layer 12, insulated from each other by a first dielectric layer 14. Preferably, the row lines 13 (corresponding to the word lines 6 of FIG. 1) are formed by first depositing the first dielectric layer 14, then removing the dielectric material where the row lines 13 are to be formed, and then filling the trenches so obtained with copper (Cu). Any excess copper is then removed from the surface of the wafer 10 by CMP ("damascene" process).

Figure 4:
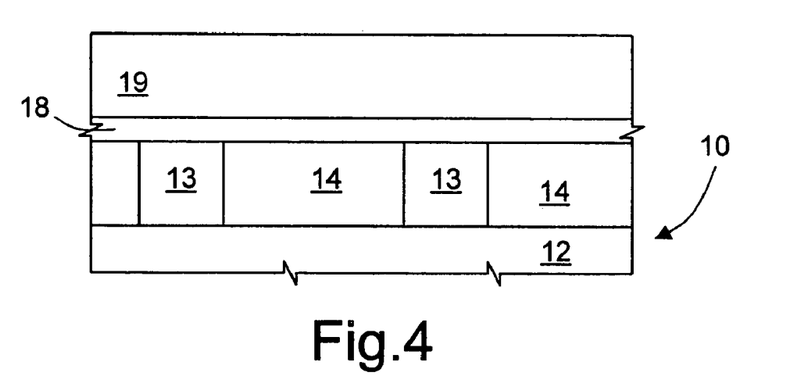

Thereafter, FIG. 4, an encapsulating structure is formed. The encapsulating structure is formed by depositing, in sequence, a first nitride layer 18 and a first oxide layer 19 (FIG. 4) and then selectively removing the first oxide layer 19 and the first nitride layer 18 until the surface of the first dielectric layer 14. Thus, FIG. 5, for each row line 13, an opening 20 is formed which extends at least in part on top of the row line 13. In particular, at least one vertical surface 20A of each opening 20 (in the drawings, on the left) extends above a respective row line 13. Each opening 20 may extend along the whole respective row line 13 or along only a part thereof, in which case a plurality of openings 20 are aligned to each other along each row line 13. The openings 20 have a substantially parallelepipedal shape, as discussed in detail hereinbelow.

Figure 5:
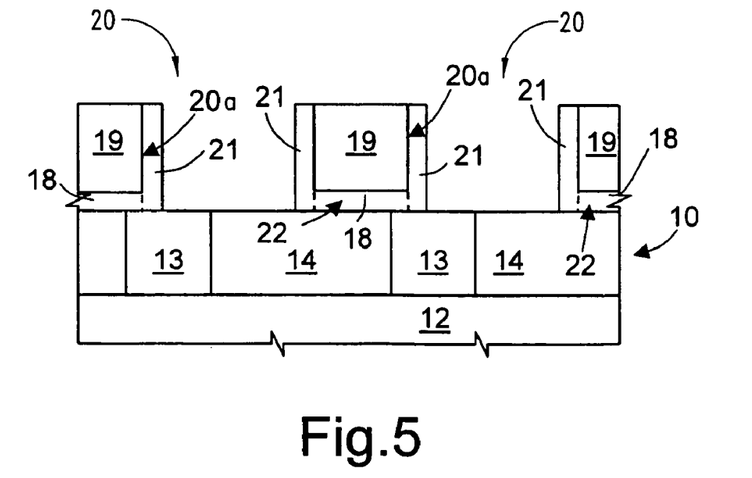

Then, a spacer layer, e.g., of silicon nitride, is deposited and etched back. Thus, the horizontal portions of the spacer layer are removed, and only vertical portions thereof, indicated at 21 and extending along the vertical surfaces 20A of the opening 20, are left. These vertical portions 21 join the first nitride layer 18 laterally to the openings 20 and form, with the first nitride layer 18, a protective region indicated by 22. Thus, the structure of FIG. 5 is obtained, wherein the protective region 22 together with the first oxide layer 19 form an encapsulating structure.

Figure 6:
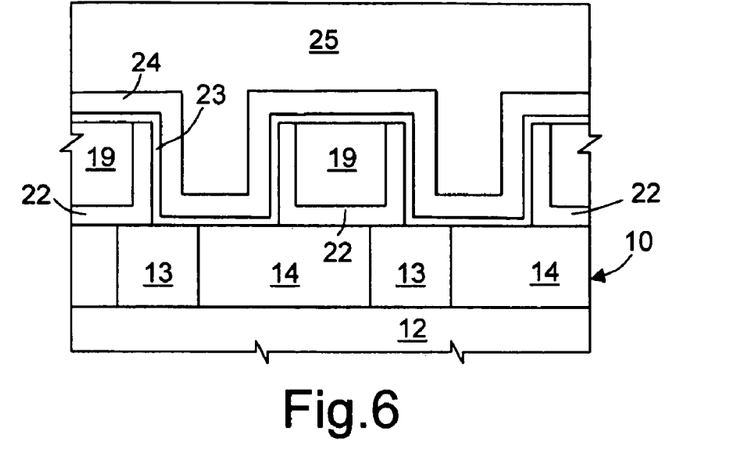

Thereafter, FIG. 6, a heater layer 23 is deposited and stabilized. For example, TiSiN is used, which conformally covers the bottom and the sides of the openings 20. Subsequently, a sheath layer 24, e.g., of silicon nitride, and a second dielectric layer 25 are deposited. The second dielectric layer 25 is deposited by SACVD USG (Sub Atmospheric Chemical Vapor Deposition Undoped Silicon Glass) or HDP USG (High Density Plasma USG) or PECVD (Plasma Enhanced Chemical Vapor Deposition USG) and completely fills the openings 20 to complete the encapsulating structure.

Figure 7:
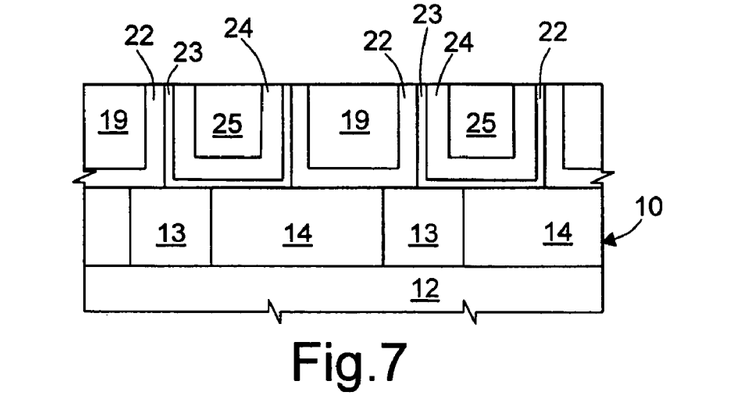

The structure is then planarized by CMP (Chemical Mechanical Polishing), thus removing all portions of the second dielectric layer 25, of the sheath layer 24 and of the heater layer 23 extending outside the openings 20, FIG. 7. In particular, the remaining portions of the heater layer 23 form a plurality of heater regions (one for each cell of the memory array), still identified by reference number 23, for sake of clarity.

Here, the sheath layer 24 and the protective region 22 isolate the heater layer 23 from the silicon oxide of the first and second oxide layers 19, 25 and prevent oxidation of the heater material.

Figure 8:
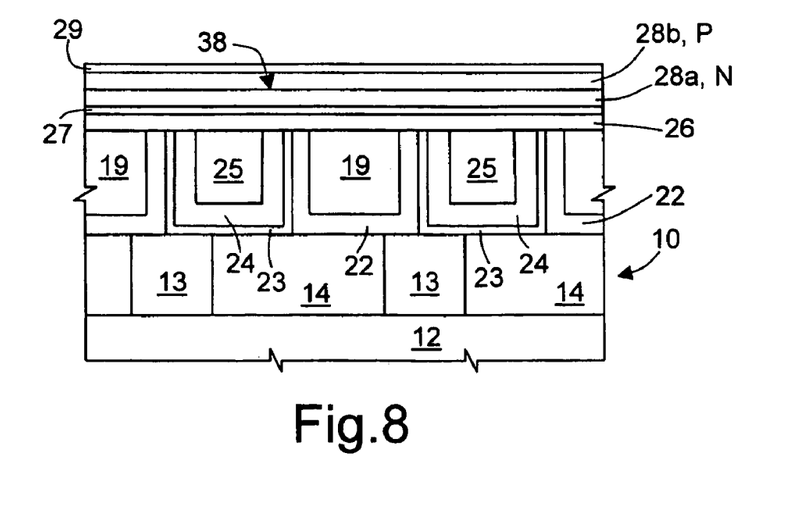

Then, FIG. 8, an OMS/OTS (Ovonic Memory Switch/Ovonic Threshold Switch) stack is deposited. In detail, a storage layer 26 of a chalcogenic material and a first barrier layer 27 (e.g., TiAlN) are first deposited on the wafer 10, so that the storage layer 26 contacts the heater regions 23. Thus, storage elements 26' are formed at intersections of the storage layer 26 and the heater regions 23. Then a first junction layer 28a, of a N-type chalcogenic material, and a second junction layer 28b, of a P-type chalcogenic material, are deposited in sequence on the first barrier layer 27. Hence, a PN junction 38 is formed at an interface between the first and second junction layers 28a, 28b. The second junction layer 28b is then coated with a second barrier layer 29, of TiAlN as well.

In the embodiment herein described, both the first and second junction layers 28a, 28b are formed by deposition in stoichiometric quantities. Suitable (but not exclusive) chalcogenic materials that may be advantageously used for building the OMS/OTS stack are the following:

for the chalcogenic storage layer 26, $Ge_2Sb_2Te_5$;

for the first junction layer 28a (N-type), $Pb_XGe_{42-X}Se_{58}$ with X=0% to 20% or $Pb_{20}Ge_YSe_{80-Y}$ with Y=17% to 24%; and for the second junction layer 28b (P-type), $As_2Se_3$ or $Ge_{20}Se_{80}$.

However, the above materials are only indicative, and any chalcogenic material or mixture of materials, including multiple layers known in the art and suitable for storing information depending on its physical state (for the storage layer 26) or for being jointed to operate as a rectifying junction (for the first and second junction layers 28a, 28b) may be used. Moreover, the first and the second junction layers 28a, 28b may be made also of other materials than chalcogenides, such as doped conductive polymers. It is to be noted that both chalcogenides and conductive polymers are suitable to be deposited at low temperature (i.e., in any case lower than 400° C.) to form steep PN junctions with good rectifying behavior. Thermal stress is thus prevented.

The OMS/OTS stack of layers 26-29 is then defined (FIG. 9) to form so called "dots" 31, on respective heater regions 23. Each dot 31 comprises a storage region 26, including a storage element 26', a first barrier region 27, a diode 30, including a first and a second junction portion 128a, 128b, from residual portions of the first and second junction layer 28a, 28b, respectively, and a second barrier region 29. Storage elements 26' are incorporated in electric dipoles (resistors), each including a residual portion of the storage layer 26 and having a first terminal at a contact area 37 with a corresponding heating region 23 and a second terminal at a first barrier region 27.

Figure 9:
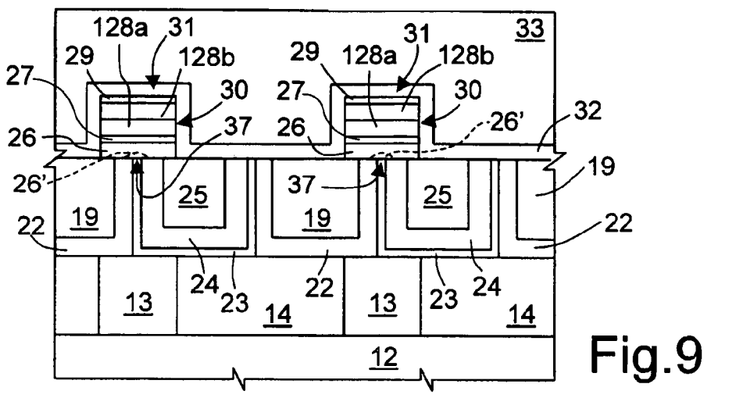
Figure 12:
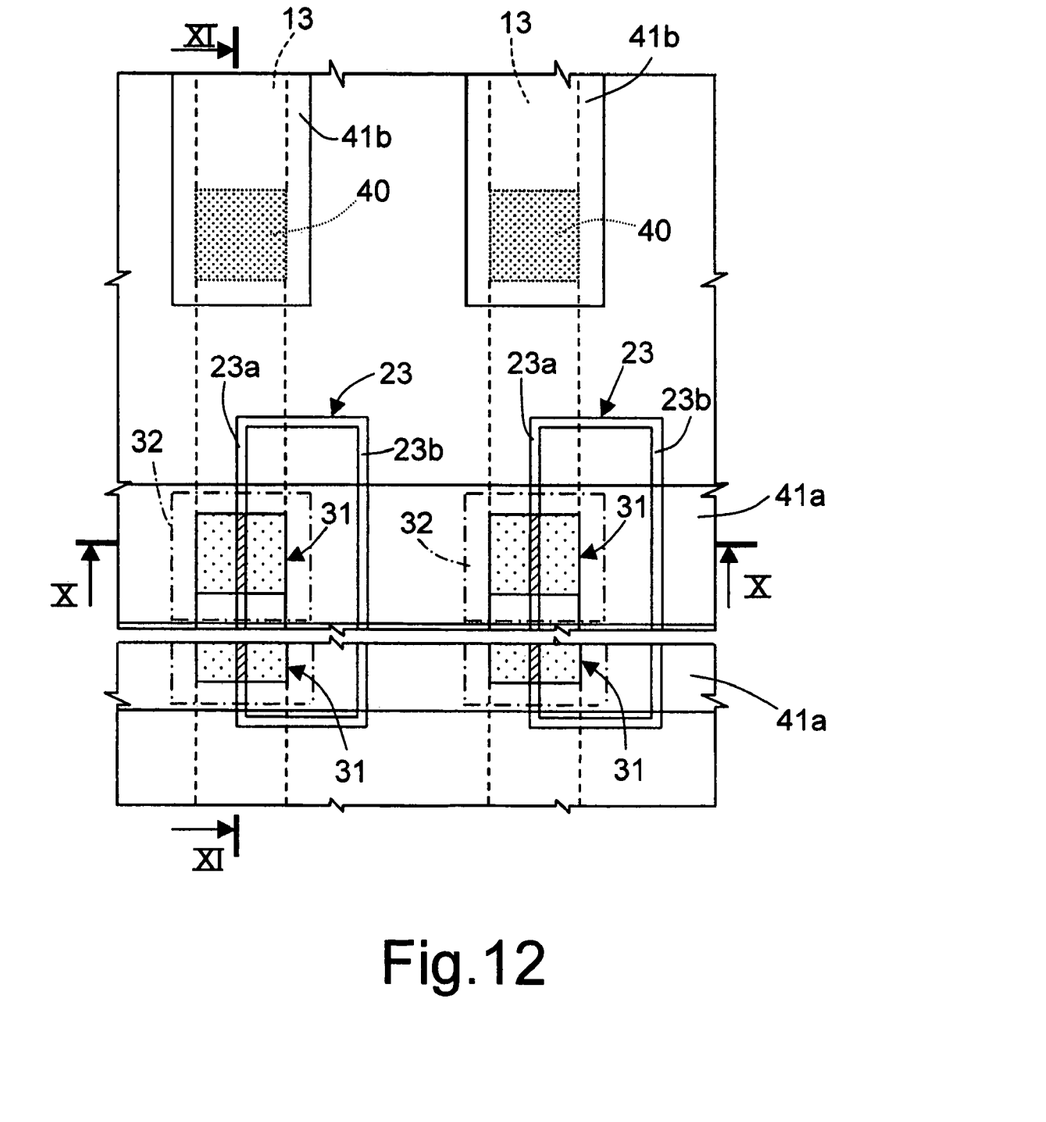
FIG. 12 is a plan view of the device of FIG. 10 and 11.

FIG. 9 shows two dots 31 which extend substantially aligned along a column of the array (see also FIG. 12).

Then a sealing layer 32, e.g., of silicon nitride, and an intermetal layer 33 of insulating material (e.g., of silicon dioxide) are deposited. Thus, the structure of FIG. 9 is obtained.

Figure 10:
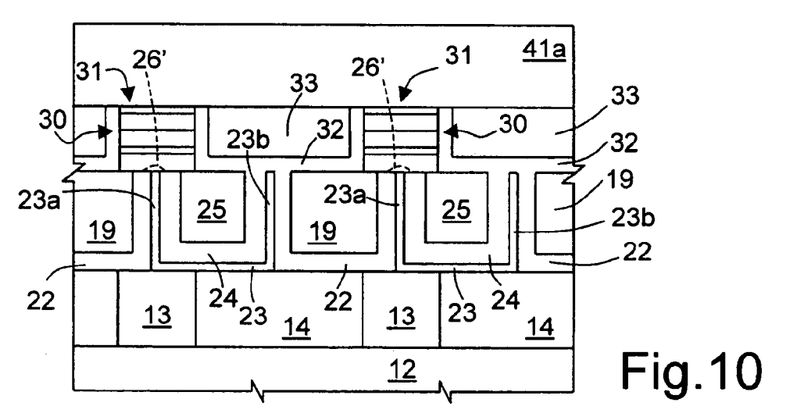
Figure 11:
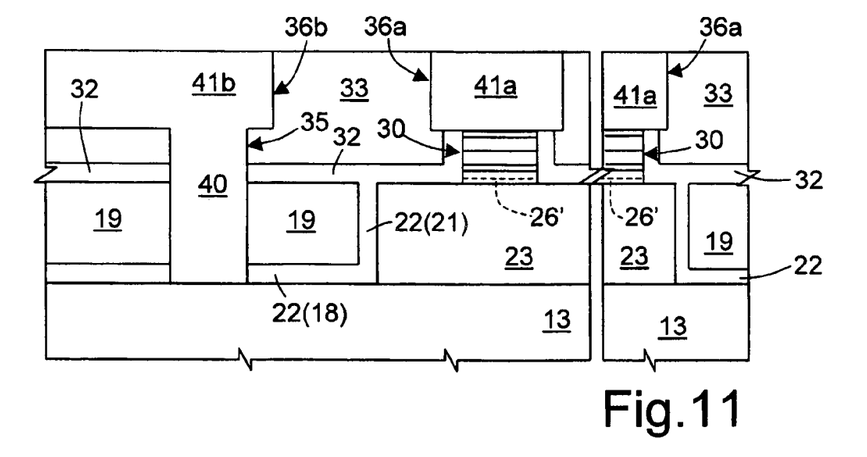
FIG. 11 shows a cross-section through the device of FIG. 10, taken along line XI-XI of FIG. 12.

Finally, the wafer is subjected to CMP to planarize the structure and column lines and vias are formed, preferably using a standard dual damascene copper process. To this end, FIG. 11, preferably the intermetal layer 33 and the first dielectric layer 14 (as well as the sealing layer 32 and the bottom of the protective region 22, where present) are etched in a two-step process to form via openings 35 (extending down to the row lines 13) and trenches 36a, 36b extending down to the top of the dots 31. The two etching steps may be carried out in any sequence. Then, a metal material (e.g., Cu) is deposited that fills the via openings 35 (FIG. 11) and the trenches 36a, 36b, forming vias 40, column lines 41a and row line connections 41b. Column lines 41a correspond to the bit lines 5 of FIG. 1. Thus the structure of FIGS. 10-12 is obtained, wherein each dot 31 is formed at the intersection between a row line 13 and a column line 41a. Obviously connections to the underneath circuitry may be provided for by this metalization level, which is not necessarily the first one.

As clearly visible from FIGS. 10 and 12, in the final structure, each heater region 23 has a substantially box-like shape corresponding to the shape of the respective opening 20 and including a bottom region and a wall region. Specifically, each heater region 23 comprises a rectangular bottom region and four wall elements including a first and a second vertical elongated wall 23a, 23b. The first vertical elongated wall 23a (on the left, in the drawings) extends approximately above the midline of the respective row line 13 and is in electrical contact therewith; the second vertical elongated wall 23b (on the right) extends on top of the first oxide layer 19. Each first vertical elongated wall 23a forms a substantially rectangular wall-shaped heater (also called a resistive element, see FIG. 11) that contacts the respective dots 31 along a line (contact area—indicated by a hatching in FIG. 12) and is shared by all the dots 31 aligned on a single row line 13, while the second vertical elongated wall 23b has no heating function. The electrical connection of all the dots 31 along a same row line 13 through the heater region 23 does not impair the operation of the memory device, since each diode 30 forms a selection element allowing accessing only the dot 31 connected to both the row line 13 and the column line 41a that are addressed.

Moreover, the PN junctions 38 show excellent rectifying properties, so that virtually no leakage currents flow through the diodes 30 when a reverse bias voltage is applied (i.e., when the corresponding cell is deselected). Thus, standard decoding circuits may be advantageously used for operating the memory array. Also, integration of the diodes 30 is very simple, owing to the use of chalcogenic materials. In fact, a single etch step and a single etching agent are sufficient for defining the OMS/OTS stack and for forming dots. In addition, the diodes are integrated in very compact cells, wherein the storage element has at least one sublithographic dimension. Another advantage resides in that steep PN junctions may be formed by deposition of chalcogenides (or conductive polymers) even in their amorphous state, i.e., at low temperature. On the contrary, PN junctions formed of conventional semiconductors only show satisfactory rectifying behavior when such materials are in their crystalline state. However, forming monocrystalline semiconductor layers requires either a high temperature (over 1000° C.) growth step, which would cause irreversible damage to the phase change storage elements, or a costly low temperature annealing step, such as laser annealing.

FIGS. 13-20 show a different embodiment of the invention. Parts that are the same as in the embodiment of FIGS. 3-12 have been designed with the same reference numbers, and the following description is centered on the specific feature of this embodiment.

Figure 13:
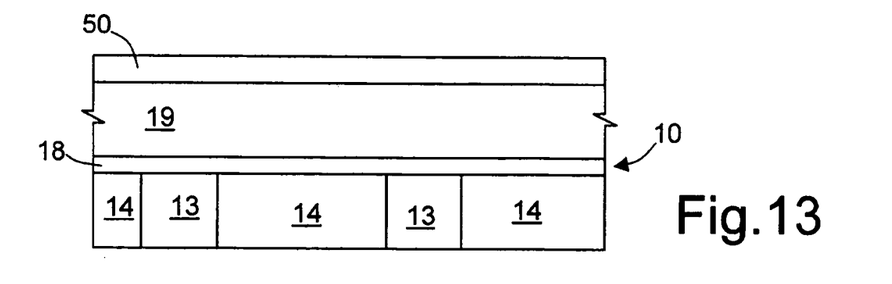
FIGS. 13-18 are cross-sections through a second embodiment of the invention, in subsequent manufacturing steps, taken along plane XVIII-XVIII of FIG. 20.
Figure 14:
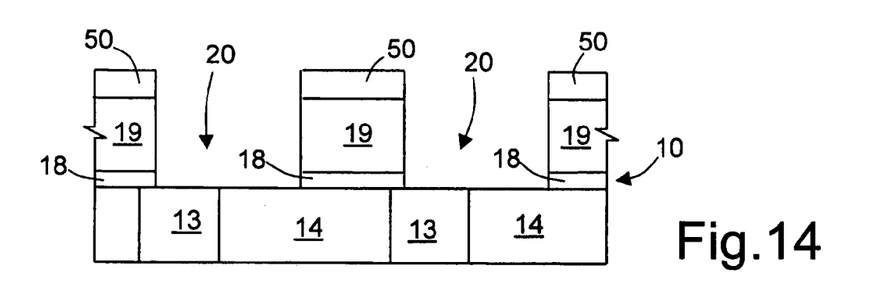

FIG. 13 shows a wafer 10 wherein row lines 13 are already formed, insulated by the first dielectric layer 14 and covered by the first nitride layer 18 and the first oxide layer 19. According to this embodiment, a glue layer 50 of metal, e.g., of Ti, is deposited on the first oxide layer 19, and only thereafter, openings 20 extending through layers 50, 19, 18 are formed (FIG. 14).

Figure 15:
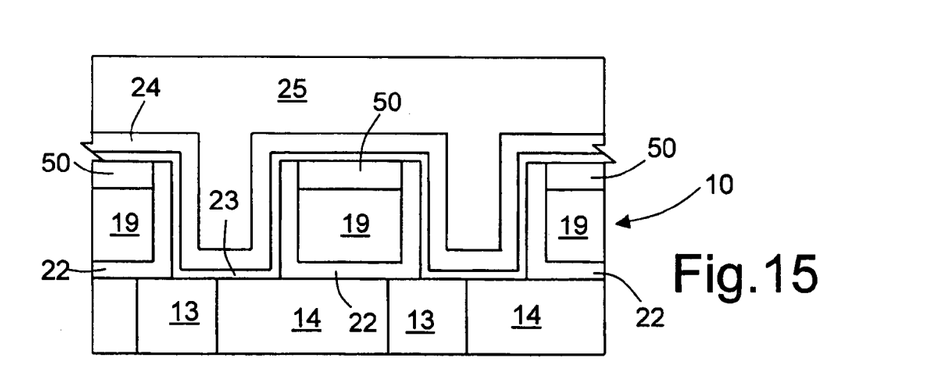

Then, FIG. 15, a spacer layer, e.g., of silicon nitride, is deposited and etched back to form, together with the first nitride layer 18, the protective region 22. Thereafter, the heater layer 23 (e.g., of TiSiN) is deposited and stabilized, the sheath layer 24, e.g., of silicon nitride, and a second dielectric layer 25 are deposited, thus obtaining the structure of FIG. 15.

Figure 16:
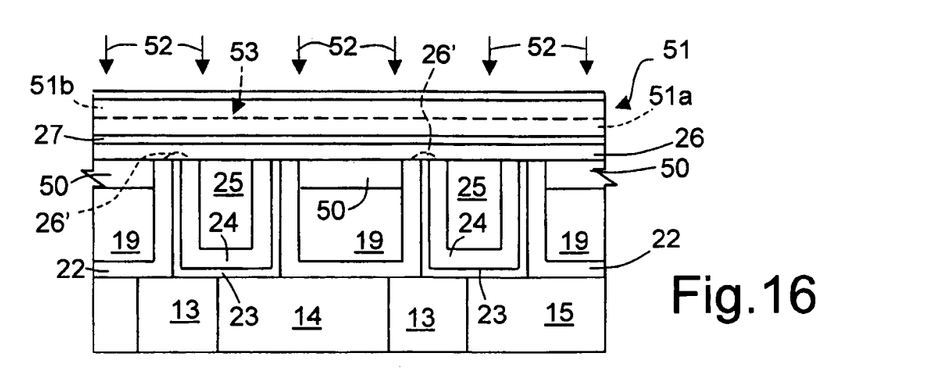
Figure 17:
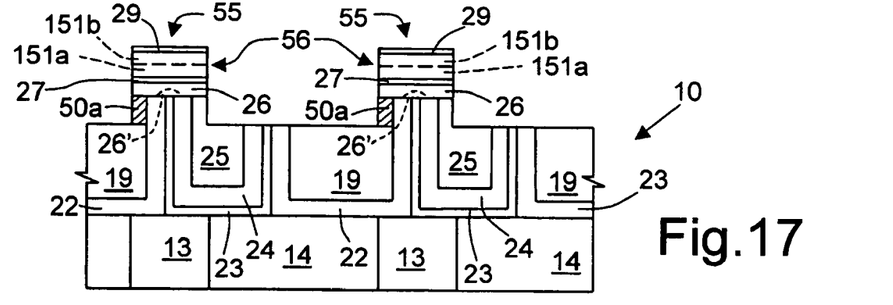

Subsequently, FIG. 16, the structure is planarized by CMP (Chemical Mechanical Polishing), and an OMS/OTS (Ovonic Memory Switch/Ovonic Threshold Switch) stack is formed.

In detail, the storage layer 26 is first deposited on the wafer 10, thereby forming the storage elements 26', and is covered with the first barrier layer 27. Then, a thick junction layer 51 of chalcogenic material is deposited on the first barrier layer 27. In this case, the material forming the junction layer 51 is $Ge_{25}Se_{75-Z}Bi_Z$ (with Z=9% to 11%). The conductivity of $Ge_{25}Se_{75-Z}Bi_Z$ depends on the concentration of Bi. In particular, $Ge_{25}Se_{75-Z}Bi_Z$ has P-type conductivity, if less than 9% of Bi is contained in the mixture, and N-type conductivity otherwise. However, other phase change materials showing the same behavior (i.e., the type of conductivity depends on the concentration of a substance of the mixture) may be used as well. The whole junction layer 51 is initially of N-type, since it contains 9% to 11% of Bi. Then, a controlled amount of Ge or of a mixture of Ge and Se is implanted in the junction layer 51 and diffused (Ge, or GeSe, is indicated by arrows 52 in FIG. 16). A deep first junction region 51a, which is downwardly in contact with the first barrier layer 27, is not affected by implantation and remains of N-type. On the contrary, the concentration of Bi in a superficial second junction region 51b is reduced to less than 9%. Accordingly, the conductivity of the second junction region 51b changes from N-type to P-type and a PN junction 53 is defined at an interface between the first and the second junction region 51a, 51b.

In alternative, the junction layer 51 may be initially of P-type $Ge_{25}Se_{75-Z}Bi_z$ (i.e., with Z<9% and, preferably, Z=0) and the N-type first junction region 51a may be obtained at a distance from the top surface of the junction layer 51, by deep implantation of a controlled amount of Bi.

Later, the OMT/OTS stack of layers 26-29 is defined (FIG. 17) to form dots 55. In this case, etching is continued to etch also the glue layer 50, thereby leaving only glue portions 50a under the dots 55. Etching should ensure removal of all the titanium material around the dots, to avoid that any metallic residuals would short the dots 55. As a consequence, as visible in FIG. 17, on the right of each dot 55, also the upper portion of the layers 19, 22, 23, 24, 25 are etched. Each dot 55 comprises a storage region 26, including a storage element 26', a first barrier region 27, a diode 56, formed in a residual portion of the junction layer 51 and including a first and a second junction portions 151a, 151b, and a second barrier region 29.

Figure 18:
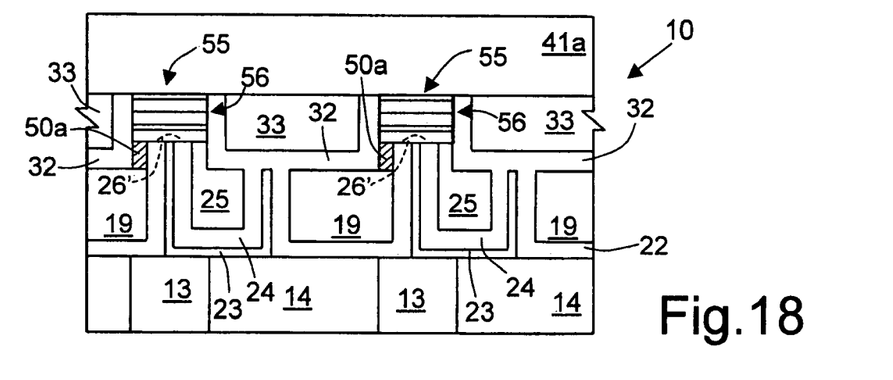
Figure 19:
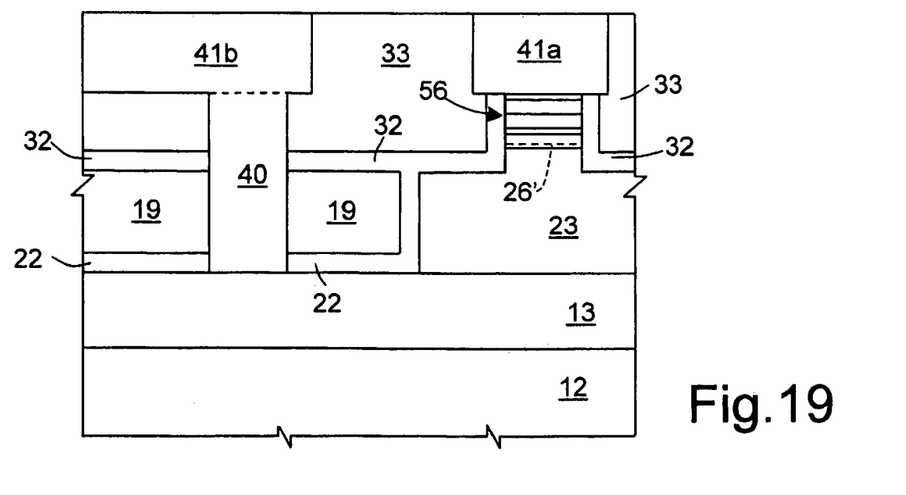
FIG. 19 is a cross-section of the device of FIG. 18, taken along plane XIX-XIX of FIG. 20.
Figure 20:
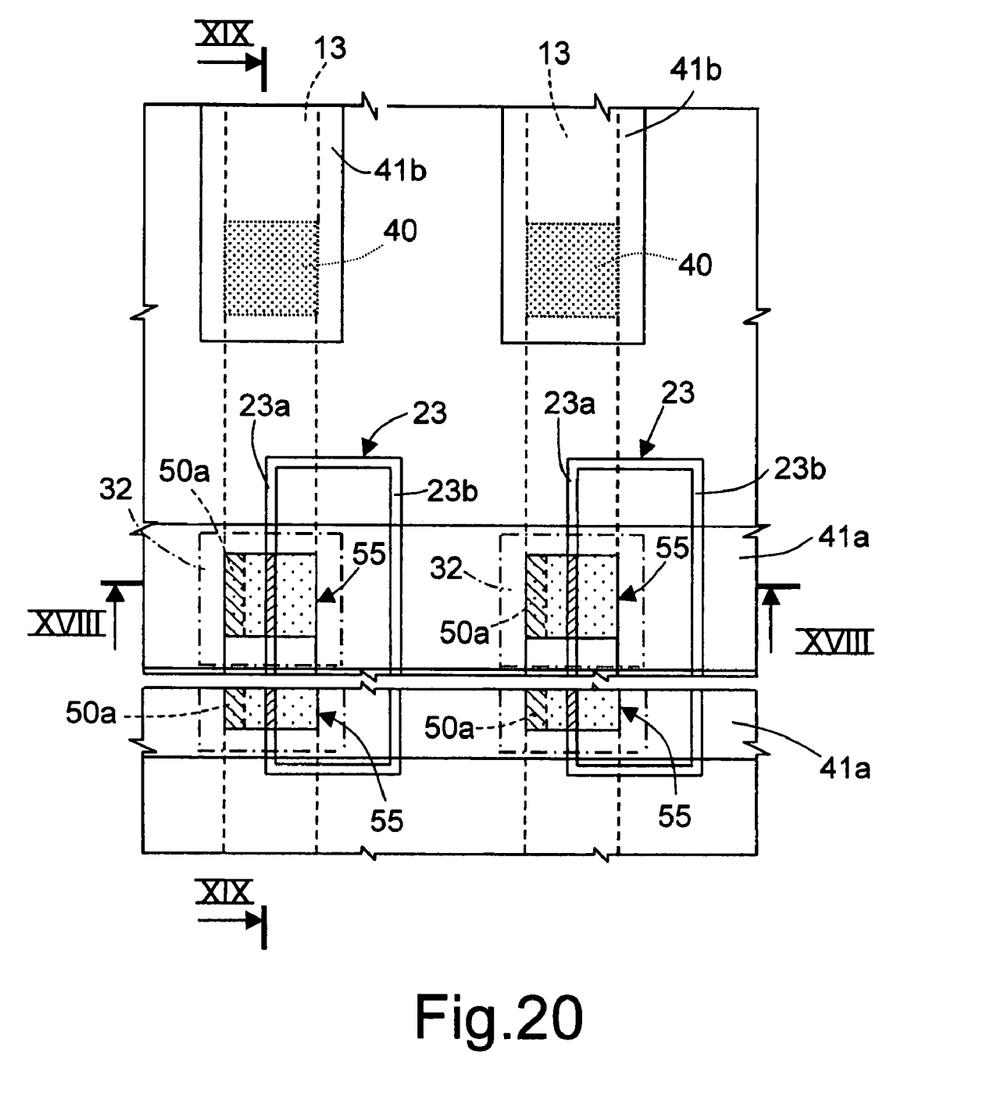
FIG. 20 is a plan view of the device of FIG. 18 and 19.

Then, FIGS. 18-20, the sealing layer 32 and the intermetal layer 33 are deposited; the wafer 10 is subjected to CMP; and the vias 40, column lines 41a and the row line connections 41b are formed, as described above.

Thus, with the embodiment of FIGS. 13-20, a glue region 50a of metal is formed under a portion of the dots 55. The glue region 50a is isolated from the respective heater 23, to avoid any electrical shorting which would prevent the correct operation of the cell. Here, the first vertical wall 23a is substantially rectangular with at least a protruding portion defining the contact area 37.

Figure 21:
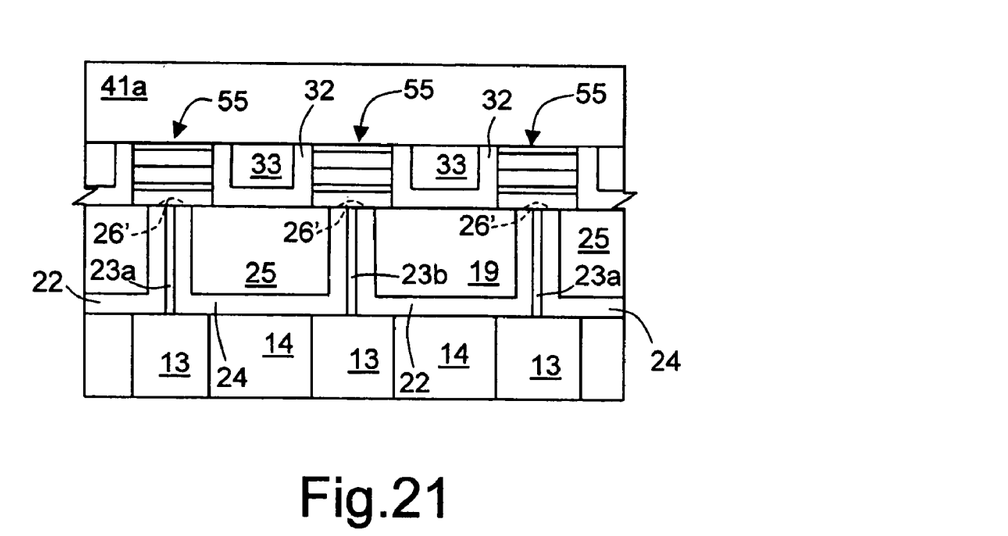
FIGS. 21 and 22 are respectively a cross-section taken along line XXI-XXI of FIG. 22 and a top view of a memory device according to a third embodiment of the invention.
Figure 22:
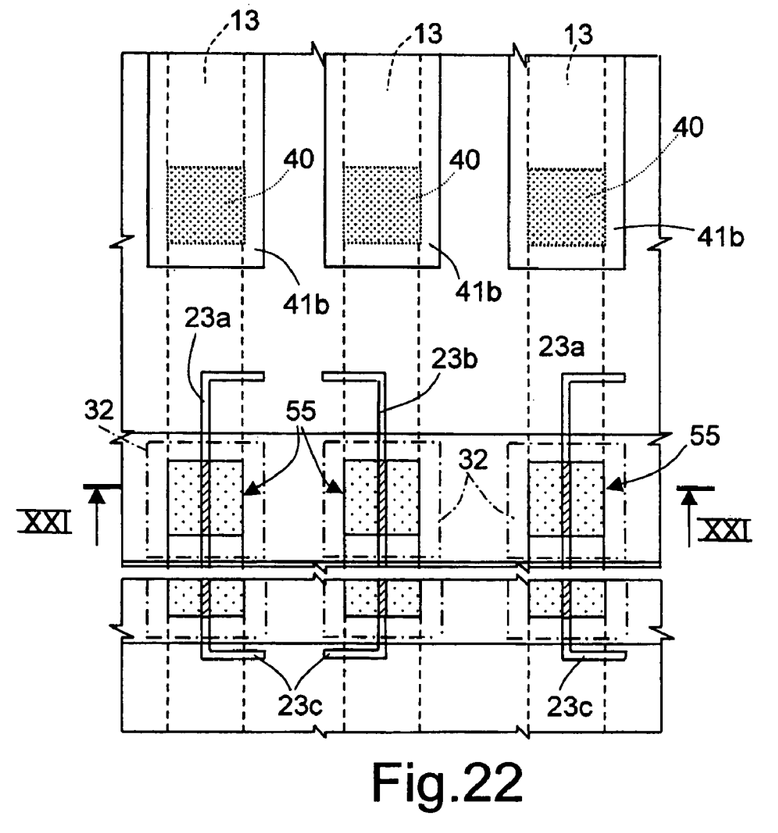

According to a different embodiment, also the second vertical elongated wall 23b (on the right in the drawings) may be used as a distinct heater element. In this case, as visible from FIGS. 21, 22, the heater layer 23 must be removed from the bottom of the openings 20 and the first and second vertical elongated walls 23a, 23b must be electrically disconnected, in order to avoid electrical short between two adjacent row lines. To this end, as visible from the top view of FIG. 22, the vertical end walls of the heater layer 23 (indicated as 23c) are interrupted, e.g., by means of a specific etching step. The cross-section of the final structure is visible in FIG. 21.

Another embodiment of the invention is shown in FIGS. 23-29, wherein parts that are the same as in the embodiment previously described have been designed with the same reference numbers.

Figure 23:
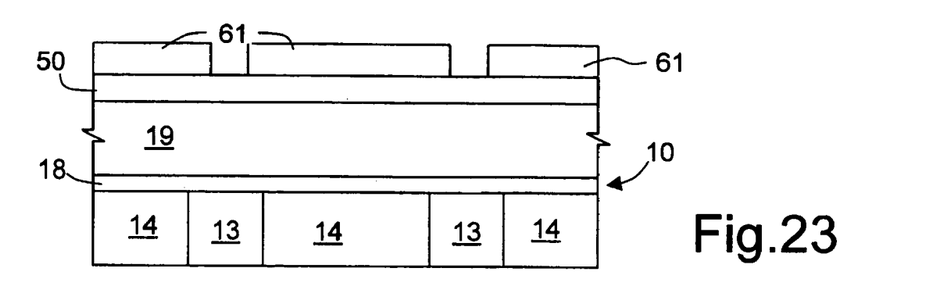
FIGS. 23-28 are cross-sections through a forth embodiment of the invention, in subsequent manufacturing steps, taken along plane XXIII-XXIII of FIG. 29.

FIG. 23 shows a wafer 10 wherein row lines 13 are already formed, insulated by the first dielectric layer 14 and covered by the first nitride layer 18, the first oxide layer 19 and the glue layer 50. According to this embodiment, holes 60 are opened through the glue layer 50, the first oxide layer 19 and the first nitride layer 18 using a lance mask 61, thereby partially exposing the row lines 13.

Figure 24:
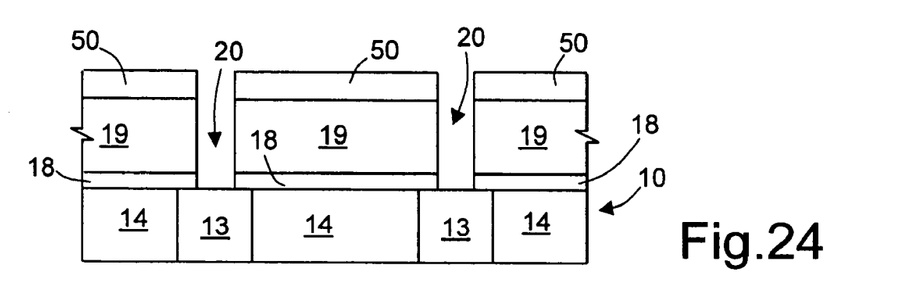
Figure 25:
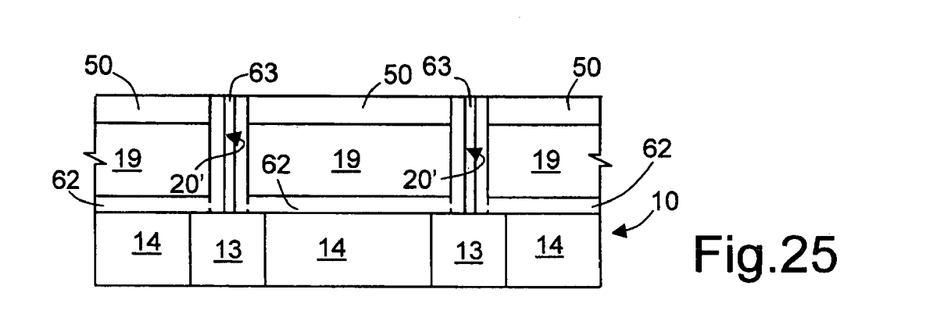

Then, FIG. 24, a spacer layer, e.g., of silicon nitride, is deposited and etched back to form, together with the first nitride layer 18, a protective region 62. The thickness of the spacer layer is controlled so that, only holes 20' remain after etch back, which have sublithographic width (FIG. 25). Thereafter, heater regions 63 (e.g., of TiSiN) are formed by depositing and stabilizing a heater layer, which fills the holes 20', and by removing portions thereof which are in excess of the holes 20'; removal is preferably obtained by CMP and is stopped on reaching the glue layer 50. Thus, heater regions 63 include resistive elements in the form of rods having sublithographic width.

Figure 26:
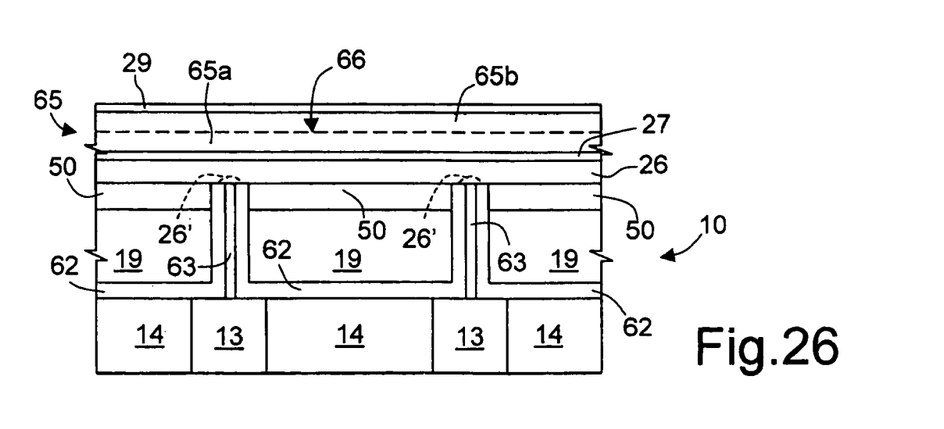
Figure 27:
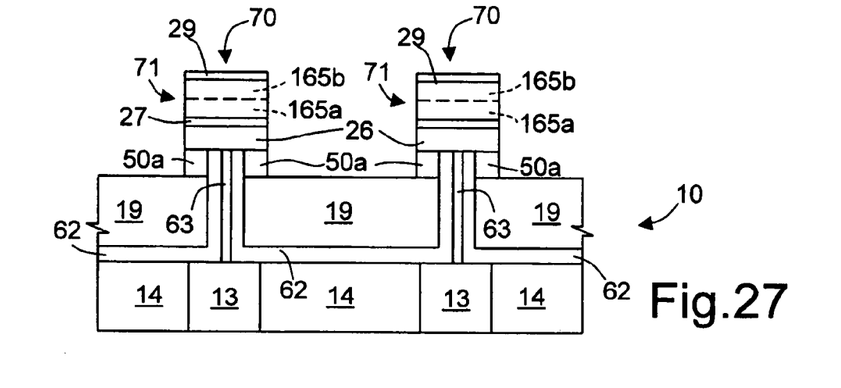

Then, an OMS/OTS (Ovonic Memory Switch/Ovonic Threshold Switch) stack is formed, thus obtaining the structure of FIG. 26. In detail, the storage layer 26 and a first barrier layer 27 are first deposited on the wafer 10, so that the storage layer 26 contacts the heater regions 63. Thus, storage elements 26' are formed at intersections of the storage layer 26 and the heater regions 63. Then, a junction layer 65, of a chalcogenic material and having variable conductivity, is formed by a vapor deposition process involving multiple sputtering. In this case, $Ge_{25}Se_{75-Z}Bi_z$ (with Z=0 to 11) is used, the conductivity whereof depends on the concentration of Bi. In particular, $Ge_{25}Se_{75-Z}Bi_z$ is of P-type if less than 9% of Bi is present and of N-type otherwise. During deposition, Ge, Se and Bi are simultaneously sputtered from three separate targets, so that a mixture thereof is provided. In order to obtain desired concentration profiles of Ge, Se and Bi, the composition of the mixture is controlled by controlling the vaporization rates of the substances from the respective targets (i.e., by controlling the power of the ion or electron beams impinging thereon). In particular, around 9% of Bi is initially added to a Ge—Se mixture, so that a first junction region 65a of the junction layer 65, having N-type conductivity, is formed.

When the first junction region 65a has reached a predetermined thickness, the concentration of Bi is decreased and the junction layer 65 is completed by forming a second junction region 65b having P-type conductivity. Hence, a PN junction 66 is defined in the junction layer 65, namely at a transition zone between the first and the second junction region 65a, 65b.

Then, the second barrier layer 29 is deposited on the junction layer 65 and the structure of FIG. 26 is obtained.

Later, the OMT/OTS stack of layers 26, 27, 65, 29 is defined (FIG. 27) to form dots 70 on respective heater regions 23. In this step, also the glue layer 50 is etched and only glue portions 50a under the dots 70 are left. Each dot 70 comprises a storage region 26, including a storage element 26', a first barrier region 27, a diode 71, formed in a residual portion of the junction layer 65 and including a first and a second junction portions 165a, 165b, and a second barrier region 29.

Figure 28:
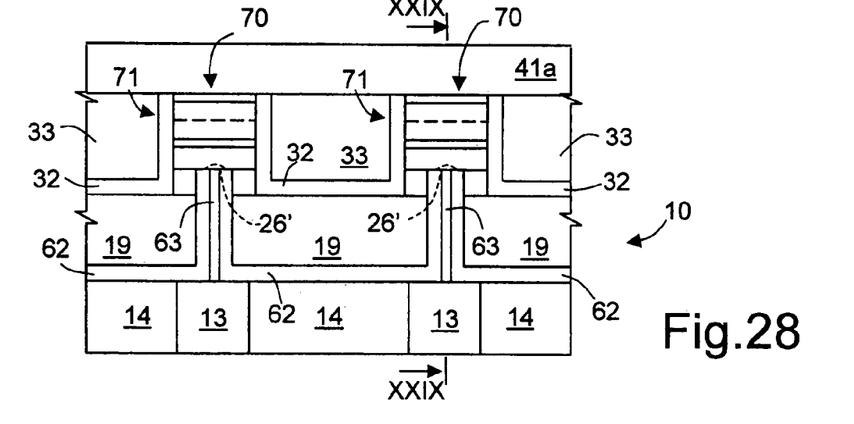
Figure 29:
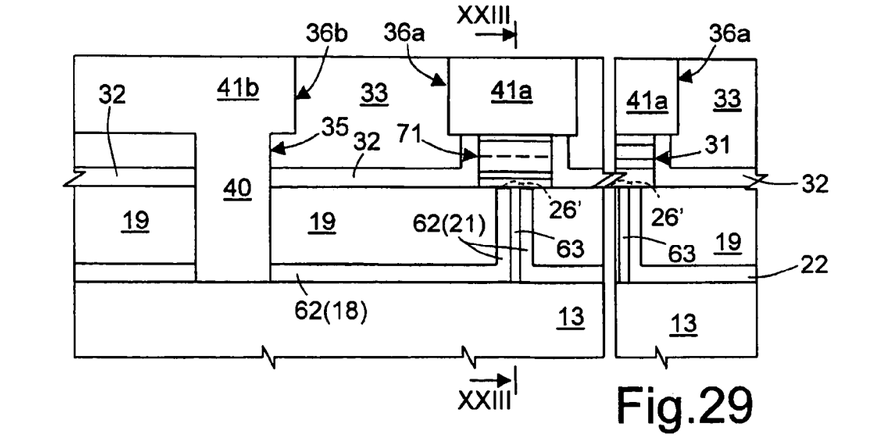
FIG. 29 is a cross-section of the device of FIG. 28, taken along plane XXIX-XXIX of FIG. 28.

Then, FIG. 28, 29, the sealing layer 32 and the intermetal layer 33 are deposited; the wafer 10 is subjected to CMP; and the vias 40, column lines 41a and the row line connections 41b are formed, as described above.

According to the embodiment of FIGS. 23-29, the conductivity profile in the transition zone between the first and the second junction region 65a, 65b may be precisely controlled, so that desired voltage-current characteristic of the diodes may be obtained.

The advantages of the present invention are clear from the above.

Finally, it is clear that numerous variations and modifications may be made to the phase change memory cell and process described and illustrated herein, all falling within the scope of the invention as defined in the attached claims. In particular, multiple sputtering may be used to form diodes for memory cells having wall-shaped heaters; versa vice, memory cells with lance-shaped heaters may include diodes made by subsequent deposition of N-type and P-type layers or by implantation.

Moreover, the memory cells may include any storage elements which are included in an electric dipole and have a low impedance state and a high impedance state, such as polymeric resistors or resistors of colossal magnetoresistive materials.

Figure 30:
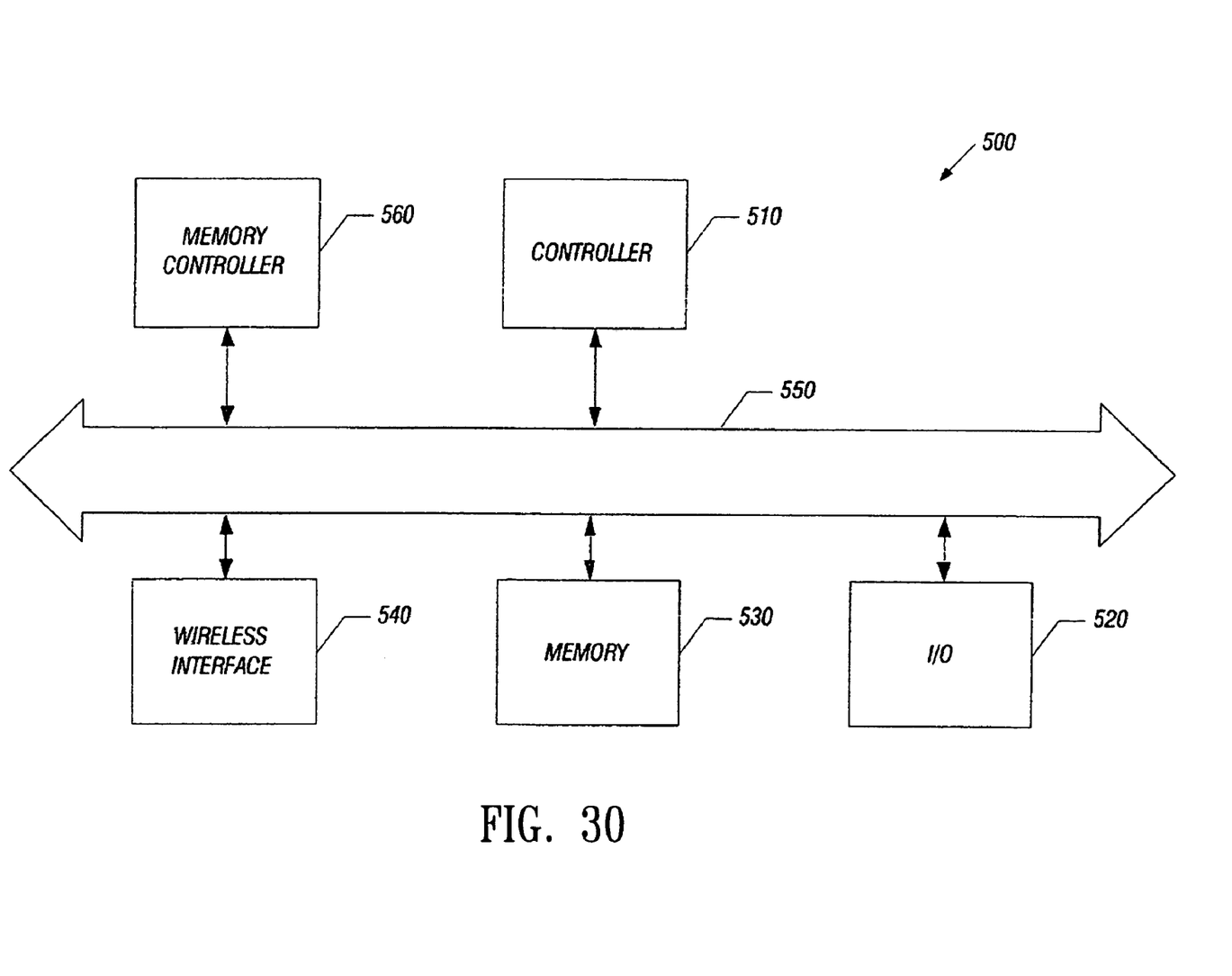
FIG. 30 is a system depiction of one embodiment of the present invention.

Turning to FIG. 30, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g., a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory and comprises the memory array shown in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or as analog information (if analog information was stored).

While an example in a wireless application is provided above, embodiments of the present invention may also be used in non-wireless applications as well.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A memory cell comprising:
    a memory element; and
    a selection element coupled to said memory element, said selection element including a first junction portion having a first type of conductivity, and a second junction portion having a second type of conductivity and forming a rectifying junction with said first junction portion, said first junction portion and said second junction portion being made of materials selected in the group consisting of: chalcogenides and conducting polymers.

2. A memory cell according to claim 1, wherein said first junction portion is made of a first material selected in the group consisting of: $Pb_XGe_{42-X}Se_{58}$ with X comprised between 0 and 20%, $Pb_{20}Ge_YSe_{80-Y}$ with Y comprised between 17% and 24%, and $Ge_{25}Se_{75-Z}Bi_Z$ with Z comprised between 9% and 11%;
    and wherein said second junction portion is made of a second material selected in the group consisting of: $As_2Se_3$, $Ge_{20}Se_{80}$ and $Ge_{25}Se_{75-Z}Bi_Z$ with Z comprised between 0 and 9%.

3. A memory cell according to claim 1, wherein said selection element is stacked on said memory element.

4. A memory cell according to claim 3, wherein said first junction portion is arranged between said memory element and said second junction portion.

5. A memory cell according to claim 4, wherein said first junction portion is of N-type and said second junction portion is of P-type.

6. A memory cell according to claim 4, further comprising a first conductive barrier region, arranged between said memory element and said first junction portion, and a second conductive barrier region on said second junction portion.

7. A memory cell according to claim 1, wherein said memory element comprises an electric dipole including a storage element, said storage element having a low impedance state and a high impedance state.

8. A memory cell according to claim 7, wherein said storage element is a phase change storage element.

9. A memory cell according to claim 8, wherein said memory cell includes a resistive heater element in contact with said storage element and having at least one sublithographic dimension at a contact area with said storage element.

10. A memory cell according to claim 9, wherein said resistive heater element includes a vertical elongated wall.

11. A memory cell according to claim 9, wherein said resistive heater element is in the form of a rod.

12. A memory cell according to claim 9, wherein phase change storage element is positioned between said resistive heater element and said selection element.

13. A process for manufacturing a memory cell, comprising the steps of:
    forming a memory element; and
    forming a selection element coupled to said memory element, forming said selection element including:
    forming a first junction portion, having a first type of conductivity;
    forming a second junction portion, having a second type of conductivity, so that said first junction portion and said second junction portion form a rectifying junction;
    wherein said first junction portion and said second junction portion are made of materials selected in the group consisting of: chalcogenides and conducting polymers.

14. A process according to claim 13, wherein said first junction portion is made of a first material selected in the group consisting of: $Pb_XGe_{42-X}Se_{58}$ with X comprised between 0 and 20%, $Pb_{20}Ge_YSe_{80-Y}$ with Y comprised between 17% and 24%, and $Ge_{25}Se_{75-Z}Bi_Z$ with Z comprised between 9% and 11%;
    and wherein said second junction portion is made of a second material selected in the group consisting of: $As_2Se_3$, $Ge_{20}Se_{80}$ and $Ge_{25}Se_{75-Z}Bi_Z$ with Z comprised between 0 and 9%.

15. A process according to claim 13, wherein said selection element is formed on said memory element.

16. A process according to claim 13, wherein said step of forming said selection element comprises forming a first junction layer on said memory element.

17. A process according to claim 16, wherein said first junction layer has said first type of conductivity and includes said first junction portion and wherein said step of forming said selection element comprises forming said second junction portion on said first junction portion.

18. A process according to claim 17, wherein said step of forming said second junction portion comprises depositing a second junction layer on said first junction layer, said second junction layer having said second type of conductivity.

19. A process according to claim 17, wherein said step of forming said second junction portion comprises introducing at least a substance into said first junction layer to form a junction region with said second type of conductivity within said first junction layer.

20. A process according to claim 16, wherein said first junction layer has said second type of conductivity and said step of forming said selection element comprises deep implanting a substance in said first junction layer, to change said second type of conductivity to said first type of conductivity in a junction region within said first junction layer, at a distance from a top surface thereof, said junction region including said first junction portion.

21. A process according to claim 13, wherein said step of forming said first junction layer comprises vapor deposition of a mixture of substances and separately controlling vaporization rates of said substances for controlling a composition of said mixture.

22. A process according to claim 21, wherein said step of forming said first junction layer comprises multiple sputtering.

23. A system comprising:
a processing unit;
an interface coupled to said processing unit; and
a nonvolatile phase change memory device coupled to said processing unit and including:
first and second memory elements;
first and second selection elements coupled to the first and second memory elements, respectively, each selection element including a first junction portion having a first type of conductivity, and a second junction portion having a second type of conductivity and forming a rectifying junction with said first junction portion, said first junction portion and said second junction portion being made of materials selected in the group consisting of:
chalcogenides and conducting polymers; and
a resistive heater element in contact with the first and second memory elements at first and second contact areas, respectively, the resistive heater element having a sublithographic dimension at the first and second contact areas.

24. A system according to claim 23, wherein said interface is a wireless interface.

25. A memory device, comprising:
first and second memory elements;
first and second selection elements coupled to the first and second memory elements, respectively, each selection element including a first junction portion having a first type of conductivity, and a second junction portion having a second type of conductivity and forming a rectifying junction with the first junction portion, the first junction portion and the second junction portion being made of materials selected in the group consisting of:
chalcogenides and conducting polymers; and
a resistive heater element in contact with the first and second memory elements at first and second contact areas, respectively, the resistive heater element having a sublithographic dimension at the first and second contact areas.

26. The memory device of claim 25, wherein the first junction portion is made of a first material selected in the group consisting of: $Pb_XGe_{42-X}Se_{58}$ with X comprised between 0 and 20%, $Pb_{20}Ge_YSe_{80-Y}$ with Y comprised between 17% and 24%, and $Ge_{25}Se_{75-Z}Bi_Z$ with Z comprised between 9% and 11%;
and wherein the second junction portion is made of a second material selected in the group consisting of: $As_2Se_3$, $Ge_{20}Se_{80}$ and $Ge_{25}Se_{75-Z}Bi_Z$ with Z comprised between 0 and 9%.

27. The memory device of claim 25, wherein the selection elements are stacked on the memory elements, respectively.

28. The memory device of claim 25, wherein for each selection element the first junction portion is arranged between the respective memory element and the second junction portion.

29. The memory device of claim 25, wherein the first junction portion is of N-type and the second junction portion is of P-type.

30. The memory device of claim 25, further comprising:
a first conductive barrier region, arranged between each memory element and the first junction portion of the selection element coupled to the memory element; and
a second conductive barrier region on each second junction portion.

31. The memory device of claim 25, wherein each memory element comprises an electric dipole including a storage element having a low impedance state and a high impedance state.

32. The memory device of claim 31, wherein the storage element is a phase change storage element.

33. The memory device of claim 32, wherein each phase change storage element is positioned between the resistive heater element and the respective selection element.

* * * * *